United States Patent
Konno

(10) Patent No.: US 9,746,766 B2
(45) Date of Patent: Aug. 29, 2017

(54) COMPOSITION FOR NANOIMPRINT AND NANOIMPRINT PATTERN FORMING METHOD

(71) Applicant: TOKYO OHKA KOGYO CO., LTD., Kawasaki-shi (JP)

(72) Inventor: Kenri Konno, Tokyo (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/097,772

(22) Filed: Apr. 13, 2016

(65) Prior Publication Data

US 2016/0306276 A1 Oct. 20, 2016

(30) Foreign Application Priority Data

Apr. 15, 2015 (JP) ................. 2015-083209

(51) Int. Cl.
| | | |
|---|---|---|
| *C08F 2/46* | (2006.01) | |
| *C08G 61/04* | (2006.01) | |
| *G03F 7/00* | (2006.01) | |
| *C09D 183/04* | (2006.01) | |
| *G03F 7/004* | (2006.01) | |
| *G03F 7/038* | (2006.01) | |
| *G03F 7/075* | (2006.01) | |

(52) U.S. Cl.
CPC ......... *G03F 7/0002* (2013.01); *C09D 183/04* (2013.01); *G03F 7/0046* (2013.01); *G03F 7/0388* (2013.01); *G03F 7/0757* (2013.01)

(58) Field of Classification Search
CPC ...... G03F 7/0002; G03F 7/057; G03F 7/0046; G03F 7/0388; C09D 183/04
USPC .................... 522/99, 1, 148; 520/1
See application file for complete search history.

(56) References Cited

FOREIGN PATENT DOCUMENTS

| JP | 2010037528 | * | 2/2010 |
| JP | 2011023698 | * | 2/2011 |
| JP | B-5560049 | | 7/2014 |

OTHER PUBLICATIONS

Dazai et al, JP 2010-037528 Part 1 Machine Translation, Feb. 18, 2010.*
Dazai et al, JP 2010-037528 Part 2, Machine Translation, Feb. 18, 2010.*
Dazai et al, JP 2010-037528 Part 3, Machine Translation, Feb. 18, 2010.*
Shimatani et al, JP 5560049 (2011023698) Machine Translation, Feb. 3, 2011.*

* cited by examiner

*Primary Examiner* — Jessica E Whiteley
(74) *Attorney, Agent, or Firm* — Knobbe Martens Olson & Bear LLP

(57) ABSTRACT

A composition for nanoimprinting including a siloxane polymer which includes a polymerizable group polymerized by irradiation with light; a polymerization initiator; and a fluorine-containing polymeric compound in which the fluorine-containing polymeric compound has a constituent unit represented by the following formula (f1-1) in which R represents a hydrogen atom, an alkyl group having 1 to 5 carbon atoms, or a halogenated alkyl group having 1 to 5 carbon atoms, $Rf^{102}$ and $Rf^{103}$ each independently represent a hydrogen atom, a halogen atom, an alkyl group having 1 to 5 carbon atoms, or a halogenated alkyl group having 1 to 5 carbon atoms, $Rf^{102}$ and $Rf^{103}$ may be the same as or different from each other, $nf^1$ represents an integer of 1 to 5, and $Rf^{101}$ represents an organic group including a fluorine atom.

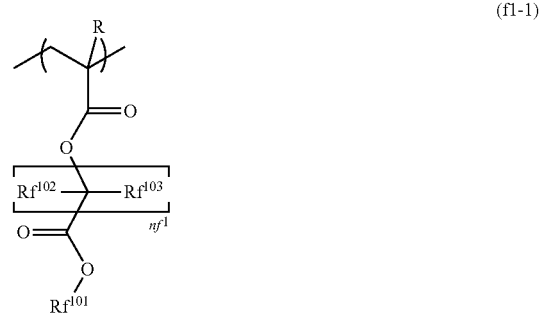

(f1-1)

7 Claims, 2 Drawing Sheets

COMPOSITION FOR NANOIMPRINT AND NANOIMPRINT PATTERN FORMING METHOD

BACKGROUND OF THE INVENTION

Field of the Invention

The present invention relates to a composition for nanoimprint and a nanoimprint pattern forming method.

Priority is claimed on Japanese Patent Application No. 2015-083209, filed on Apr. 15, 2015, the contents of which are incorporated herein by reference.

Description of Related Art

A lithography technology is a core technology of a semiconductor device process, and further miniaturization of wiring has been promoted with high integration of a semiconductor integrated circuit (IC) in recent years. As the miniaturization method, a method of shortening the wavelength of a light source by means of using a light source having a shorter wavelength such as a KrF excimer laser, an ArF excimer laser, an $F_2$ laser, extreme ultraviolet light (EUV), electron beams (EB), or X-rays or a method of making the diameter of a numerical aperture (NA) of a lens of an exposure device large (making the NA large) is typically exemplified.

In these circumstances, nanoimprint lithography in which a mold on which a predetermined pattern is formed is pressed against a substrate formed with a resin layer on the surface thereof and the pattern of the mold is transferred to the resin layer has been suggested.

In the nanoimprint lithography, optical nanoimprint lithography using a composition for nanoimprint that contains a photocurable resin cured by light (ultraviolet rays or electron beams) has been suggested. In this process, a mold is pressed against a resin layer including a photocurable resin, the resin layer is irradiated with light so as to cure the resin, and the mold is peeled off from the resin layer, thereby obtaining a transfer pattern (structure).

As characteristics generally required for the composition for nanoimprint used for the nanoimprint lithography, coating properties required when a substrate is coated with the composition using spin coating or the like or curing properties required when heating or exposing is performed are exemplified. When the coating properties are degraded, the film thickness of the composition for nanoimprint, which is applied to the substrate, becomes uneven and this leads to deterioration of pattern transferability at the time when a mold is pressed. In addition, the curing properties are important characteristics because the pattern formed by pressing the mold is maintained at a desired size.

For example, Patent Literature 1 discloses a composition for nanoimprint in which polymers are blended at a predetermined blending ratio and coating properties and curing properties are improved.

DOCUMENTS OF RELATED ART

Patent Literature

[Patent Document 1] Japanese Patent No. 5560049

SUMMARY OF THE INVENTION

In the nanoimprint lithography, since a mold is pressed against a resin layer and the mold is peeled off from the resin layer, mold releasing properties are required for the composition for nanoimprint used for the nanoimprint lithography.

The present invention has been made in consideration of the above-described problems, and an object thereof is to provide a composition for nanoimprint having excellent mold releasing properties and a nanoimprint pattern forming method using the composition for nanoimprint.

According to a first aspect of the present embodiment, there is provided a composition for nanoimprint including: a siloxane polymer (A) which includes a polymerizable group polymerized by irradiation with light; a polymerization initiator (C); and a fluorine-containing polymeric compound (F), in which the fluorine-containing polymeric compound (F) has a constituent unit represented by the following formula (f1-1).

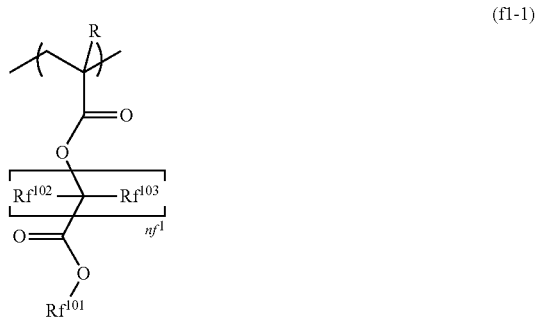

(f1-1)

In formula (f1-1), R represents a hydrogen atom, an alkyl group having 1 to 5 carbon atoms, or a halogenated alkyl group having 1 to 5 carbon atoms, $Rf^{102}$ and $Rf^{103}$ each independently represent a hydrogen atom, a halogen atom, an alkyl group having 1 to 5 carbon atoms, or a halogenated alkyl group having 1 to 5 carbon atoms, $Rf^{102}$ and $Rf^{103}$ may be the same as or different from each other, $nf^1$ represents an integer of 1 to 5, and $Rf^{101}$ represents an organic group including a fluorine atom.

According to a second aspect of the present embodiment, there is provided a nanoimprint pattern forming method including: coating a substrate with the composition for nanoimprint according to the first aspect of the present embodiment to form a resin layer of the composition for nanoimprint; pressing a mold, on which an uneven structure having a predetermined pattern is formed, on the resin layer of the composition for nanoimprint and deforming the resin layer of the composition for nanoimprint to the predetermined pattern; and exposing the resin layer of the composition for nanoimprint to light in a state where the mold is pressed.

According to a third aspect of the present embodiment, there is provided a nanoimprint pattern forming method including: forming an organic layer on an inorganic substrate; coating the organic layer with the composition for nanoimprint according to the first aspect to form a resin layer of the composition for nanoimprint; pressing a mold, on which an uneven structure having a predetermined pattern is formed, to the resin layer of the composition for nanoimprint and deforming the resin layer of the composition for nanoimprint to the predetermined pattern; and exposing the resin layer of the composition for nanoimprint to light in a state where the mold is pressed.

According to the present invention, it is possible to provide a composition for nanoimprint having excellent mold releasing properties and a nanoimprint pattern forming method using the composition for nanoimprint.

DETAILED DESCRIPTION OF THE INVENTION

Composition for Nanoimprint

Figure 1A:
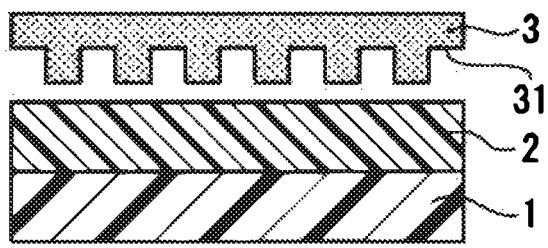
FIG. 1A is a schematic illustration of an example of a nanoimprint pattern forming method according to the present embodiment.

A composition for nanoimprint of the present embodiment contains a siloxane polymer (A) which includes a polymerizable group polymerized by irradiation with light; a polymerization initiator (C); and a fluorine-containing polymeric compound (F).

Hereinafter, each component will be described in detail.

Siloxane Polymer (A)

The siloxane polymer (A) constituting the composition for nanoimprint of the present embodiment (hereinafter, also referred to as a component (A)) is a polymeric compound having a polymerizable group that is polymerized by irradiation with light. Specifically, a polymer represented by the following formula (A1) is preferable.

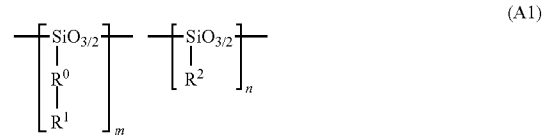

(A1)

[In formula (A1), $R^1$ represents a group containing an ethylenic unsaturated double bond, $R^0$ represents an alkylene group having 1 to 9 carbon atoms, m number of $R^0$ groups which are different from each other may be included, $R^2$ represents an alkyl group, an aryl group, or a hydrogen atom, n number of $R^2$ groups which are different from each other may be included; and m:n is in a range of 50:50 to 100:0].

[$R^1$]

In formula (A1), as the group containing an ethylenic unsaturated double bond in $R^1$, a group having an ethylenic unsaturated double bond in the terminal thereof is preferable and a group represented by the following formula (A1-1-1) or (A1-1-2) is particularly preferable.

In a case where m $R^1$'s are included, m $R^1$'s may be different from each other.

In the formula, the symbol "*" indicates a binding site.

(A1-1-1)

(A1-1-2)

[$R^0$]

In formula (A1), examples of the alkylene group having 1 to 9 carbon atoms as $R^0$ include a linear or branched alkylene group. As $R^0$, a linear or branched alkylene group having 1 to 7 carbon atoms is preferable, a linear alkylene group having 1 to 5 carbon atoms is more preferable, and a methylene group, an ethylene group, or an n-propylene group is particularly preferable. In a case where m $R^0$'s are included, m $R^0$'s may be different from each other.

[$R^2$]

In formula (A1), examples of the alkyl group as $R^2$ include an alkyl group having 1 to 10 carbon atoms. Specific examples thereof include a linear alkyl group such as a methyl group, an ethyl group, a propyl group, a butyl group, a pentyl group, a hexyl group, a heptyl group, an octyl group, a nonyl group, or a decyl group; a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group; and a cyclic alkyl group such as a cyclopentyl group, a cyclohexyl group, an adamantly group, a norbornyl group, an isobornyl group, or a tricyclodecanyl group. As the alkyl group in $R^2$, an alkyl group having 1 to 5 carbon atoms is preferable, an alkyl group having 1 to 3 carbon atoms is more preferable, and a methyl group is particularly preferable.

In addition, a hydrogen atom in the alkyl group as $R^2$ may be substituted with a halogen atom. In terms of the mold releasing properties, a fluorine atom is most preferable as the halogen atom.

In formula (A1), examples of the aryl group as $R^2$ include a phenyl group, a biphenyl group, a fluorenyl group, a naphthyl group, an anthryl group, and a phenanthryl group. As the aryl group in $R^2$, a phenyl group is preferable. Moreover, the aryl group as $R^2$ may have a substituent such as an alkyl group.

In a case where n $R^2$'s are included, n $R^2$'s may be different from each other.

In formula (A1), m:n (molar ratio) may be appropriately set in consideration of the Si content ratio, adjustment of the film thickness, and adjustment of pressing force. m:n (molar ratio) is preferably in a range of 50:50 to 99:1, more preferably in a range of 70:30 to 99:1, still more preferably in a range of 80:20 to 99:1, and particularly preferably in a range of 90:10 to 99:1. When m increases, the curing properties become excellent.

As the siloxane polymer represented by formula (A1), a polymer represented by the following formula (A1-1) or (A1-2) is particularly preferable.

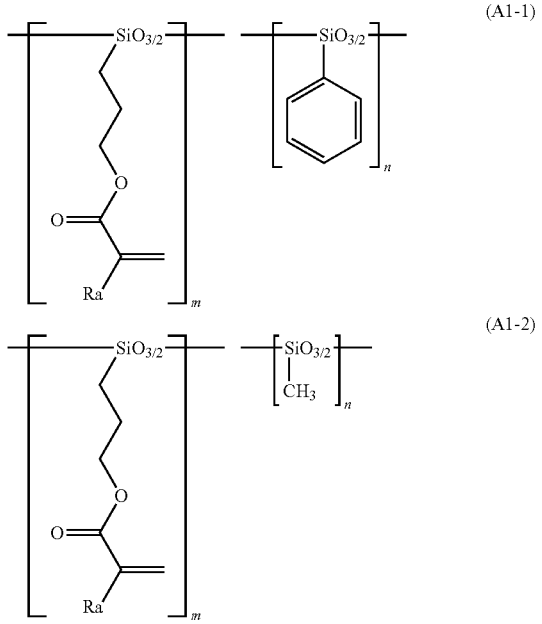

In formulae (A1-1) and (A1-2), Ra represents a methyl group or a hydrogen atom, and m and n have the same definition as that for m and n in formula (A1).

The mass average molecular weight of the component (A) is not particularly limited, but is preferably in a range of 500 to 10000, more preferably in a range of 1000 to 5000, and still more preferably in a range of 1000 to 3000. When the mass average molecular weight thereof is in the above-described range, the balance between improvement of effects for reducing the pressing force and improvement of characteristics of a pattern shape to be formed becomes excellent. The component (A) may be used alone or in combination of two or more kinds thereof.

Polymerization Initiator (C)

The polymerization initiator (C) (hereinafter, also referred to as a component (C)) is not particularly limited as long as the polymerization initiator is a compound that initiates and accelerates polymerization of the siloxane polymer (A) at the time of irradiation with light, and examples thereof include 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethane-1-one, bis(4-dimethylaminophenyl)ketone, 2-methyl-1-(4-methylthiophenyl)-2-morpholinopropan-1-one, 2-benzyl-2-dimethylamino-1-(4-morpholinophenyl)-butane-1-one, ethanone-1-[9-ethyl-6-(2-methylbenzoyl)-9H-carbazole-3-yl]-1-(o-acetyloxime), 2,4,6-trimethylbenzoyl diphenyl phosphine oxide, 4-benzoyl-4'-methyl dimethyl sulfide, 4-dimethylamino benzoate, methyl 4-dimethylamino benzoate, ethyl 4-dimethylamino benzoate, butyl 4-dimethylamino benzoate, 4-dimethylamino-2-ethylhexyl benzoate, 4-dimethylamino-2-isoamino benzoate, benzyl-β-methoxyethyl acetal, benzyl dimethyl ketal, 1-phenyl-1,2-propanediol-2-(o-ethoxycarbonyl)oxime, methyl o-benzoyl benzoate, 2,4-diethyl thioxanthone, 2-chlorothioxanthone, 2,4-dimethyl thioxanthone, 1-chloro-4-propoxy thioxanthone, thioxanthone, 2-chlorothioxanthene, 2,4-diethyl thioxanthene, 2-methyl thioxanthene, 2-isopropyl thioxanthene, 2-ethyl anthraquinone, octamethyl anthraquinone, 1,2-benzanthraquinone, 2,3-diphenyl anthraquinone, azobisisobutyronitrile, benzoyl peroxide, cumene peroxide, 2-mercaptobenzimidazole, 2-mercaptobenzoxazole, 2-mercaptobenzothiazole, a 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxy benzophenone, benzoyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxy acetophenone, p-dimethyl acetophenone, p-dimethylaminopropiophenone, dichloroacetophenone, trichloroacetophenone, p-tert-butyl trichloroacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropyl thioxanthone, dibenzosuberone, pentyl-4-dimethylaminobenzoate, 9-phenyl acridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trischloromethyl)-s-triazine, 2-[2-(furan-2-yl)ethenyl-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazone, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine; ketone peroxides such as methyl ethyl ketone peroxide, methyl isobutyl ketone peroxide, and cyclohexanone peroxide; diacyl peroxides such as isobutyryl peroxide and bis(3,5,5-trimethylhexanoyl)peroxide; hydroperoxides such as p-methane hydroperoxide and 1,1,3,3-tetramethyl butyl hydroperoxide; dialkyl peroxides such as 2,5-dimethyl-2,5-bis(t-butylperoxide)hexane; peroxyketals such as 1,1-bis(t-butylperoxy)-3,3,5-trimethylcyclohexane; peroxyesters such as t-butyl peroxyneodecanoate and 1,1,3,3-tetramethyl peroxyneodecanoate; peroxydicarbonates such as di-n-propyl peroxydicarbonate and diisopropyl peroxydicarbonate; and azo compounds such as azobisisobutyronitrile, 2,2'-azobis(2,4-dimethylvaleronitrile), and 2,2'-azobisisobutyrate.

Among these, 2-methyl-1-(4-methylthiophenyl)-2-morpholinopropan-1-one, 2,2-dimethoxy-1,2-diphenylethane-1-one, 1-[4-(2-hydroxyethoxy)-phenyl]-2-hydroxy-2-methyl-1-propan-1-one, 1-hydroxy-cyclohexyl-phenyl-ketone, 2-hydroxy-2-methyl-1-phenyl-propan-1-one, iodonium, (4-methylphenyl) [4-(2-methylpropyl)phenyl]-hexafluorophosphate, a mixture of 2-[2-oxo-2-phenylacetoxyethoxy]ethyl ester and 2-(2-hydroxyethoxy)ethyl ester, phenyl glycosylate, and benzophenone are preferable.

These polymerization initiators are commercially available, and IRGACURE 907, IRGACURE 369, IRGACURE 651 (all manufactured by Ciba Specialty Chemicals Inc.), and the like are available on the market. These polymerization initiators may be used alone or in combination of two or more kinds thereof.

The content of the component (C) in the composition for nanoimprint is preferably in a range of 0.1 parts by mass to 10 parts by mass, more preferably in a range of 0.1 parts by mass to 5 parts by mass, and still more preferably in a range of 0.1 parts by mass to 1 part by mass with respect to 1 part by mass of the component (A) included in the composition for nanoimprint. When the content thereof is in the above-described range, photocurability becomes excellent.

<Fluorine-Containing Polymeric Compound (F)>

The fluorine-containing polymeric compound (F) (hereinafter, also referred to as a "component (F)") contained in the composition for nanoimprint of the present embodiment will be described. The component (F) has a constituent unit represented by the following formula (f1-1).

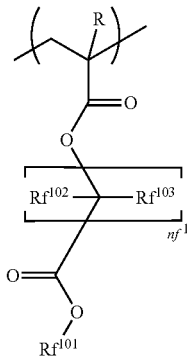

(f1-1)

[In formula (f1-1), R represents a hydrogen atom, an alkyl group having 1 to 5 carbon atoms, or a halogenated alkyl group having 1 to 5 carbon atoms. $Rf^{102}$ and $Rf^{103}$ each independently represent a hydrogen atom, a halogen atom, an alkyl group having 1 to 5 carbon atoms, or a halogenated alkyl group having 1 to 5 carbon atoms. $Rf^{102}$ and $Rf^{103}$ may be the same as or different from each other. $nf^1$ represents an integer of 1 to 5, and $Rf^{101}$ represents an organic group including a fluorine atom.]

[R]

In formula (f1-1), it is preferable that the alkyl group having 1 to 5 carbon atoms as R is a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of hydrogen atoms of the alkyl group having 1 to 5 carbon atoms are substituted with halogen atoms. Examples of the halogen atom include a fluorine atom, a chlorine atom, a bromine atom, and an iodine atom and a fluorine atom is particularly preferable.

As R in formula (f1-1), a hydrogen atom, an alkyl group having 1 to 5 carbon atoms, or a fluorinated alkyl group having 1 to 5 carbon atoms is preferable and a hydrogen atom or a methyl group is most preferable from the viewpoint of industrial availability.

[$Rf^{102}$ and $Rf^{103}$]

In formula (f1-1), examples of the halogen atom as $Rf^{102}$ and $Rf^{103}$ include a fluorine atom, a chlorine atom, a bromine atom, and an iodine atom, and a fluorine atom is particularly preferable. Examples of the alkyl group having 1 to 5 carbon atoms as $Rf^{102}$ and $Rf^{103}$ are the same as those of the alkyl group having 1 to 5 carbon atoms as R described above, and a methyl group or an ethyl group is preferable. Specific examples of the halogenated alkyl group having 1 to 5 carbon atoms as $Rf^{102}$ and $Rf^{103}$ include groups in which a part or all of hydrogen atoms of the alkyl group having 1 to 5 carbon atoms are substituted with halogen atoms. Examples of the halogen atoms include a fluorine atom, a chlorine atom, a bromine atom, and an iodine atom and a fluorine atom is particularly preferable. Among these, it is preferable that $Rf^{102}$ and $Rf^{103}$ represent a hydrogen atom, a fluorine atom, or an alkyl group having 1 to 5 carbon atom and more preferable that $Rf^{102}$ and $Rf^{103}$ represent a hydrogen atom, a fluorine atom, a methyl group, or an ethyl group.

[$nf^1$]

In formula (f1-1), $nf^1$ represents an integer of 1 to 5, preferably an integer of 1 to 3, and more preferably an integer of 1 or 2.

[$Rf^{101}$]

In formula (f1-1), $Rf^{101}$ represents an organic group including a fluorine atom and preferably a hydrocarbon group including a fluorine atom.

The hydrocarbon group including a fluorine atom may be linear, branched, or cyclic, and the number of carbon atoms is preferably in a range of 1 to 20, more preferably in a range of 1 to 15, and particularly preferably in a range of 1 to 10.

As the alkyl group having 1 to 10 carbon atoms as the hydrocarbon group including a fluorine atom, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, and a 2,2-dimethylbutyl group.

Moreover, in the hydrocarbon group including a fluorine atom, it is preferable that 25% or greater of hydrogen atoms in the hydrocarbon group is fluorinated, more preferable that 50% or greater of hydrogen atoms in the hydrocarbon group is fluorinated, and particularly preferable that 60% or greater of hydrogen atoms in the hydrocarbon group is fluorinated from the viewpoint that the contact angle of a resin layer can be improved in a case where the resin layer is formed using the composition for nanoimprint and the properties of releasing from the mold are improved.

Among the above-described examples, as $Rf^{101}$, a fluorinated hydrocarbon group having 1 to 6 carbon atoms is particularly preferable, and a methyl group, $—CH_2—CF_3$, $—CH_2—CF_2—CF_3$, $—CH(CF_3)_2$, $—CH_2—CH_2—CF_3$, or $—CH_2—CH_2—CF_2—CF_2—CF_2—CF_3$ is most preferable.

In the present invention, the proportion of the constituent unit represented by formula (f1-1) in the component (F) to the total amount of the constituent units constituting the component (F) is preferably in a range of 20% by mole to 99% by mole, more preferably in a range of 40% by mole to 95% by mole, and particularly preferably in a range of 60% by mole to 90% by mole.

In the present invention, it is preferable that the component (F) has a constituent unit including an alicyclic hydrocarbon group in addition to the constituent unit represented by formula (f1-1) above.

As the constituent unit including an alicyclic hydrocarbon group, a constituent unit (a1) (hereinafter, also referred to as a "constituent unit (a1)") including an aliphatic cyclic group is preferable.

Constituent Unit (a1)

The aliphatic cyclic group included in the constituent unit (a1) may be polycyclic or monocyclic. As a monocyclic alicyclic hydrocarbon group, a group formed by removing one or more hydrogen atoms from monocycloalkane is preferable. The number of carbon atoms of the monocycloalkane is preferably in a range of 3 to 8, and specific examples thereof include cyclopentane, cyclohexane, and cyclooctane. As a polycyclic alicyclic hydrocarbon group, a group formed by removing one or more hydrogen atoms from polycycloalkane is preferable. The number of carbon atoms of the polycycloalkane is preferably in a range of 7 to 12, and specific examples thereof include adamantane, norbornane, isobornane, tricyclodecane, and tetracyclododecane.

In addition, the above-described aliphatic cyclic group may have a substituent.

Examples of the substituent include an alkyl group, an alkoxy group, a halogen atom, a halogenated alkyl group, a hydroxyl group, and a carbonyl group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is most preferable.

Examples of the halogen atom as the substituent include a fluorine atom, a chlorine atom, a bromine atom, and an iodine atom, and a fluorine atom is preferable.

Examples of the halogenated alkyl group as the substituent include groups in which a part or all of hydrogen atoms of the alkyl group are substituted with the halogen atoms.

As the constituent unit (a1), a constituent unit having an aliphatic cyclic group represented by the following formula (a1-r2-1) is preferable.

Further, the constituent unit (a1) may be a constituent unit having a group that includes an aliphatic cyclic group represented by the following formula (a1-r2-2).

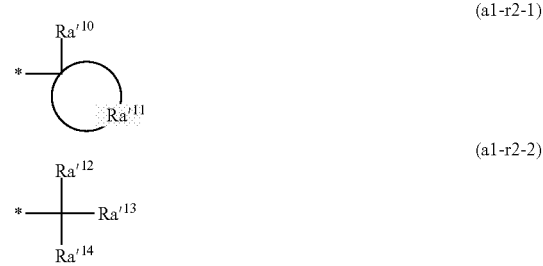

(a1-r2-1)

(a1-r2-2)

[In the formula, $Ra'^{10}$ represents a hydrogen atom or an alkyl group having 1 to 10 carbon atoms, $Ra'^{11}$ represents a group that forms an aliphatic cyclic group together with a carbon atom to which $Ra'^{10}$ is bonded. $Ra'^{12}$ and $Ra'^{14}$ each independently represent a hydrogen atom or a hydrocarbon group, and $Ra'^{13}$ represents an aliphatic cyclic group. The symbol "*" indicates a binding site.]

In formula (a1-r2-1), as the alkyl group having 1 to 10 carbon atoms in $Ra'^{10}$, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, and a 2,2-dimethylbutyl group.

In formula (a1-r2-1), the aliphatic cyclic group formed by $Ra'^{11}$ may be polycyclic or monocyclic. A group formed by removing one hydrogen atom from monocycloalkane is preferable as a monocyclic alicyclic hydrocarbon group. Monocycloalkane having 3 to 8 carbon atoms is preferable as the monocycloalkane, and specific examples thereof include cyclopentane, cyclohexane, and cyclooctane. As a polycyclic alicyclic hydrocarbon group, a group formed by removing one hydrogen atom from polycycloalkane is preferable. The number of carbon atoms of the polycycloalkane is preferably in a range of 7 to 12, and specific examples thereof include adamantane, norbornane, isobornane, tricyclodecane, and tetracyclododecane.

In formula (a1-r2-2), it is preferable that $Ra'^{12}$ and $Ra'^{14}$ each independently represent an alkyl group having 1 to 10 carbon atoms. As the alkyl group, a group exemplified as a linear or branched alkyl group in $Ra'^{10}$ in formula (a1-r2-1) is more preferable, a linear alkyl group having 1 to 5 carbon atoms is still more preferable, and a methyl group or an ethyl group is particularly preferable.

In formula (a1-r2-2), it is preferable that $Ra'^{13}$ represents a group which is the same as the aliphatic cyclic group formed by $Ra'^{11}$ in formula (a1-r2-1) above.

Specific examples of a group represented by formula (a1-r2-1) will be described below. In the following formulae, the symbol "*" indicates a binding site.

(r-pr-m1)

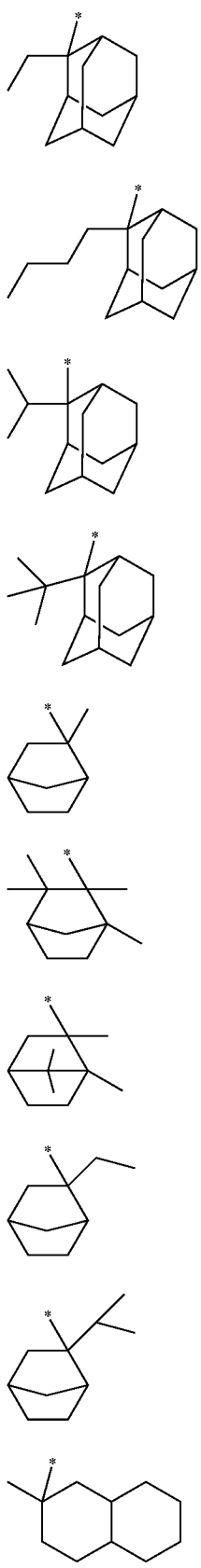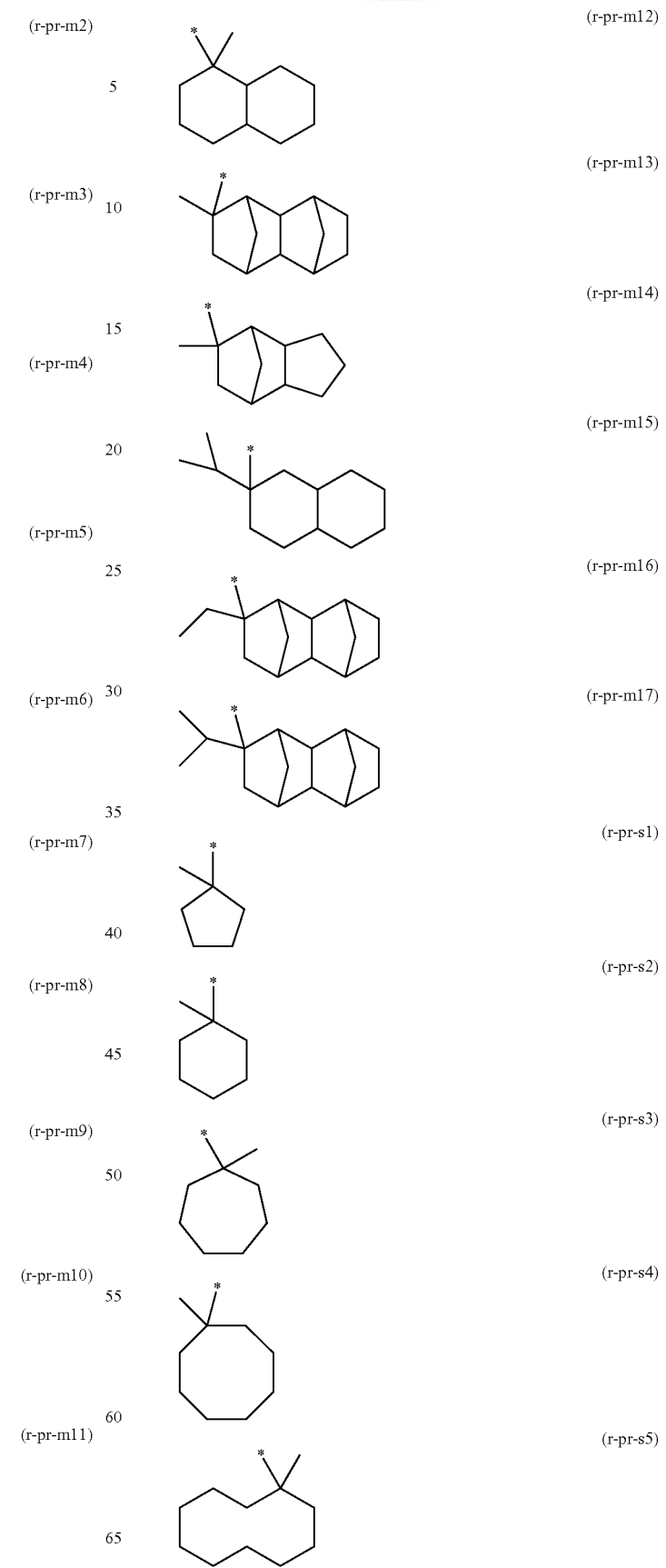

(r-pr-s6)
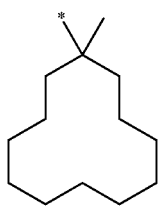
(r-pr-s7)
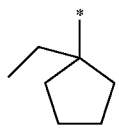
(r-pr-s8)
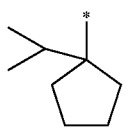
(r-pr-s9)
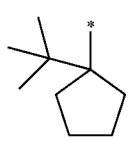
(r-pr-s10)
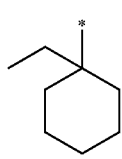
(r-pr-s11)
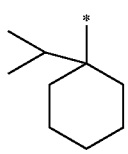
(r-pr-s12)
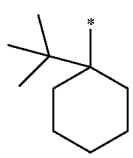
(r-pr-s13)
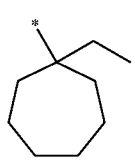
(r-pr-s14)
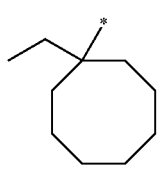
(r-pr-s15)
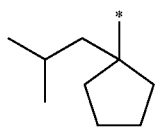
(r-pr-s16)
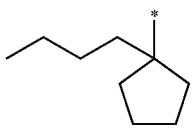
(r-pr-s17)
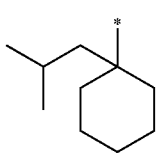
(r-pr-s18)
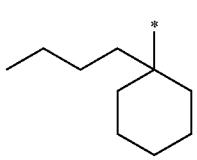
Specific examples of a group represented by formula (a1-r2-2) will be described below.
(r-pr-cm1)
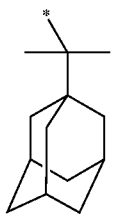
(r-pr-cm2)
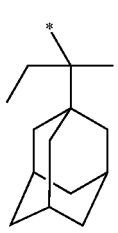
(r-pr-cm3)
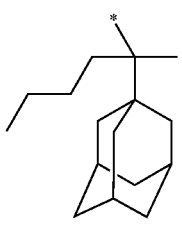
(r-pr-cm4)
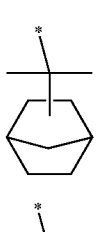
(r-pr-cs1)

-continued

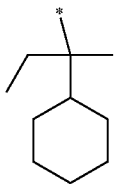
(r-pr-cs2)

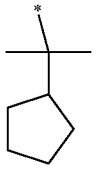
(r-pr-cs3)

As the constituent unit (a1), a constituent unit derived from an acrylic acid ester in which a hydrogen atom bonded to the carbon atom at the α-position may be substituted with a substituent is preferable.

As the constituent unit (a1), a constituent unit represented by the following Formula (a1-1) or (a1-2) is preferable.

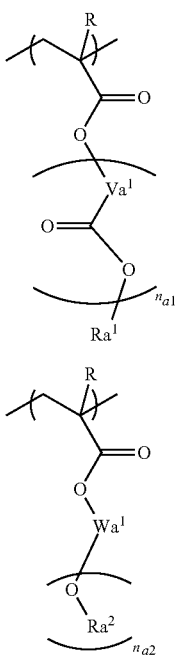
(a1-1)

(a1-2)

[In the formulae, R represents an alkyl group having 1 to 5 carbon atoms or a halogenated alkyl group having 1 to 5 carbon atoms. $Va^1$ represents a divalent hydrocarbon group which may have an ether bond, a urethane bond, or an amide bond, $n_{a1}$ represents a value of 0 to 2, and $Ra^1$ represents an aliphatic cyclic group represented by formula (a1-r2-1) or (a1-r2-2).

$Wa^1$ represents a ($n_{a2}$+1) valent hydrocarbon group, $n_{a2}$ represents a value of 1 to 3, $Ra^2$ represents a group having an aliphatic cyclic group represented by formula (a1-r2-1) or a group having an aliphatic cyclic group represented by formula (a1-r2-2).]

[R]

In formula (a1-1), it is preferable that the alkyl group having 1 to 5 carbon atoms as R is a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of hydrogen atoms of the alkyl group having 1 to 5 carbon atoms are substituted with halogen atoms. Examples of the halogen atom include a fluorine atom, a chlorine atom, a bromine atom, and an iodine atom and a fluorine atom is particularly preferable.

As R, a hydrogen atom, an alkyl group having 1 to 5 carbon atoms, or a fluorinated alkyl group having 1 to 5 carbon atoms is preferable and a hydrogen atom or a methyl group is most preferable from the viewpoint of industrial availability.

[$Va^1$]

The hydrocarbon group as $Va^1$ may be an aliphatic hydrocarbon group or an aromatic hydrocarbon group. The aliphatic hydrocarbon group indicates a hydrocarbon group which does not have aromaticity. The aliphatic hydrocarbon group as the divalent hydrocarbon group in $Va^1$ may be saturated or unsaturated, but it is preferable that the aliphatic hydrocarbon group is typically saturated.

More specific examples of the aliphatic hydrocarbon group include a linear or branched aliphatic hydrocarbon group and an aliphatic hydrocarbon group having a ring in the structure.

In addition, the divalent hydrocarbon group as $Va^1$ may be a divalent hydrocarbon group having an ether bond, a urethane bond, or an amide bond.

The number of carbon atoms of the linear or branched aliphatic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include alkylalkylene groups, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$—, or —$CH_2CH(CH_3)CH_2CH_2$—. As the alkyl group in the alkylalkylene group, a branched alkyl group having 1 to 5 carbon atoms is preferable.

Examples of the aliphatic hydrocarbon group having a ring in the structure include an alicyclic hydrocarbon group (group formed by removing two hydrogen atoms from an aliphatic hydrocarbon group), a group in which an alicyclic hydrocarbon group is bonded to the terminal of a linear or branched aliphatic hydrocarbon group, and a group in which an alicyclic hydrocarbon group is present in the middle of a linear or branched aliphatic hydrocarbon group. Examples of the linear or branched aliphatic hydrocarbon group are the same as those described above.

The number of carbon atoms of the alicyclic hydrocarbon group is preferably in a range of 3 to 20 and more preferably in a range of 3 to 12. The alicyclic hydrocarbon group may be polycyclic or monocyclic.

A group formed by removing two hydrogen atoms from monocycloalkane is preferable as the monocyclic alicyclic hydrocarbon group. Monocycloalkane having 3 to 6 carbon atoms is preferable as the monocycloalkane, and specific examples thereof include cyclopentane and cyclohexane. As the polycyclic alicyclic hydrocarbon group, a group formed by removing two hydrogen atoms from polycycloalkane is preferable, and the number of carbon atoms of the polycycloalkane is preferably in a range of 7 to 12. Specific examples thereof include adamantane, norbornane, isobornane, tricyclodecane, and tetracyclododecane.

The aromatic hydrocarbon group is a hydrocarbon group having aromaticity.

The number of carbon atoms of the aromatic hydrocarbon group as the divalent hydrocarbon group in $Va^1$ described above is preferably in a range of 3 to 30, more preferably in a range of 5 to 30, still more preferably in a range of 5 to 20, particularly preferably in a range of 6 to 15, and most preferably in a range of 6 to 10. In this case, the number of carbon atoms does not include the number of carbon atoms of substituents.

Specific examples of an aromatic ring included in the aromatic hydrocarbon group include an aromatic hydrocarbon ring such as benzene, biphenyl, fluorene, naphthalene, anthracene, or phenanthrene; and an aromatic heterocycle in which some carbon atoms constituting the aromatic hydrocarbon ring are substituted with heteroatoms. Examples of the heteroatoms in the aromatic heterocycle include an oxygen atom, a sulfur atom, and a nitrogen atom.

Specific examples of the aromatic hydrocarbon ring include a group (arylene group) formed by removing two hydrogen atoms from the aromatic hydrocarbon ring; and a group (group formed by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group) in which one hydrogen atom of a group (aryl group) formed by removing one hydrogen atom from the aromatic hydrocarbon ring is substituted with an alkylene group. The number of carbon atoms of the alkylene group (alkyl chain in the arylalkyl group) is preferably in a range of 1 to 4, more preferably 1 or 2, and particularly preferably 1.

[$Wa^1$]

In formula (a1-2), the ($n_{a2}$+1) valent hydrocarbon group as $Wa^1$ may be an aliphatic hydrocarbon group or an aromatic hydrocarbon group. The aliphatic hydrocarbon group indicates a hydrocarbon group which does not have aromaticity. The aliphatic hydrocarbon group may be saturated or unsaturated, but it is preferable that the aliphatic hydrocarbon group is typically saturated. Examples of the aliphatic hydrocarbon group include a linear or branched aliphatic hydrocarbon group, an aliphatic hydrocarbon group having a ring in the structure, and a group formed by combining a linear or branched aliphatic hydrocarbon group and an aliphatic hydrocarbon group having a ring in the structure. Specific examples of a group as $Wa^1$ are the same as those for $Va^1$ in formula (a1-1) described above.

The valence of ($n_{a2}$+1) is preferably di- to tetravalent and more preferably divalent or trivalent.

As the constituent unit represented by formula (a1-2), a constituent unit represented by the following formula (a1-2-01) is particularly preferable.

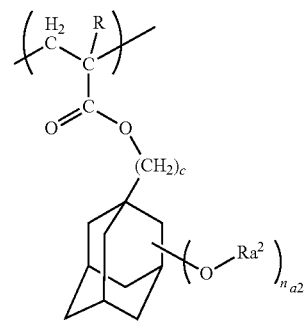

(a1-2-01)

In formula (a1-2-01), $Ra^2$ represents a group represented by formula (a1-r2-1) or (a1-r2-2). $n_{a2}$ represents an integer of 1 to 3, preferably 1 or 2, and more preferably 1. c represents an integer of 0 to 3, preferably 0 or 1, and more preferably 1. R has the same definition as described above.

Hereinafter, specific examples of the constituent unit represented by formula (a1-1) or (a1-2) will be described. In each of the following formulae, $R^\alpha$ represents a hydrogen atom, a methyl group, or a trifluoromethyl group.

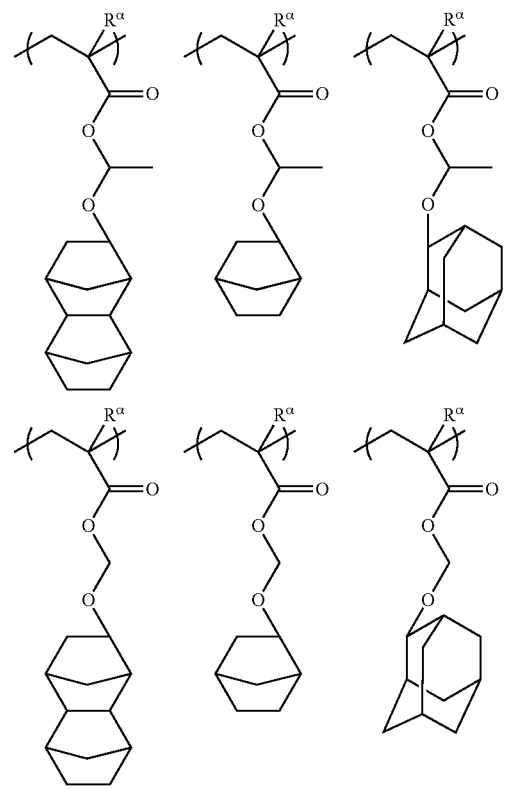

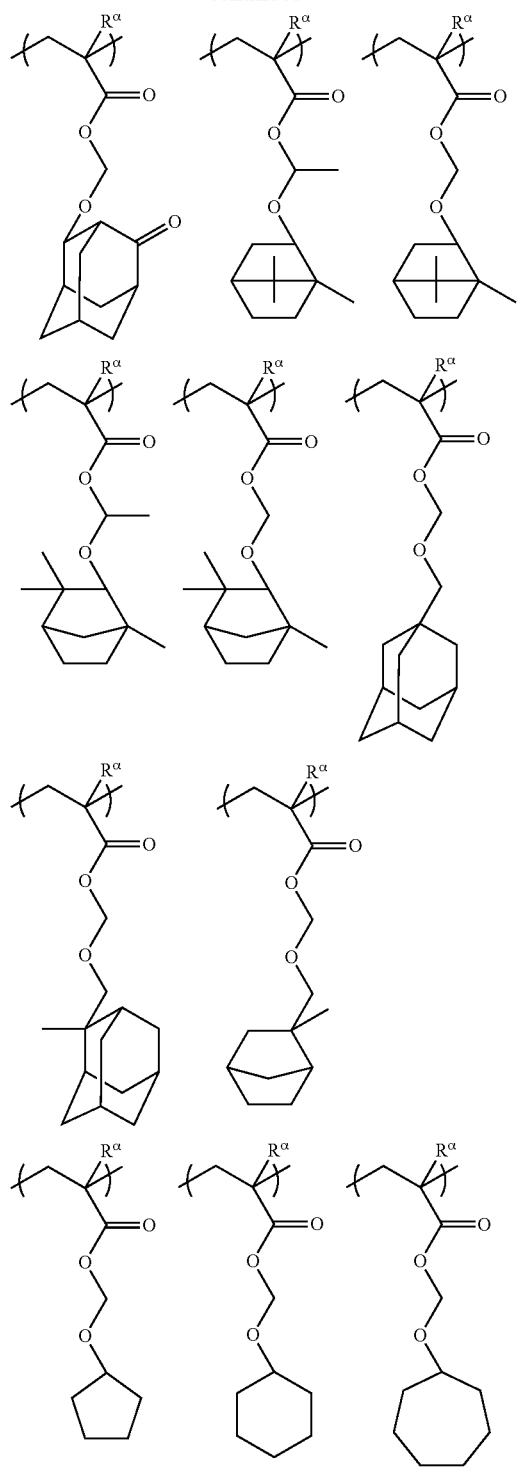
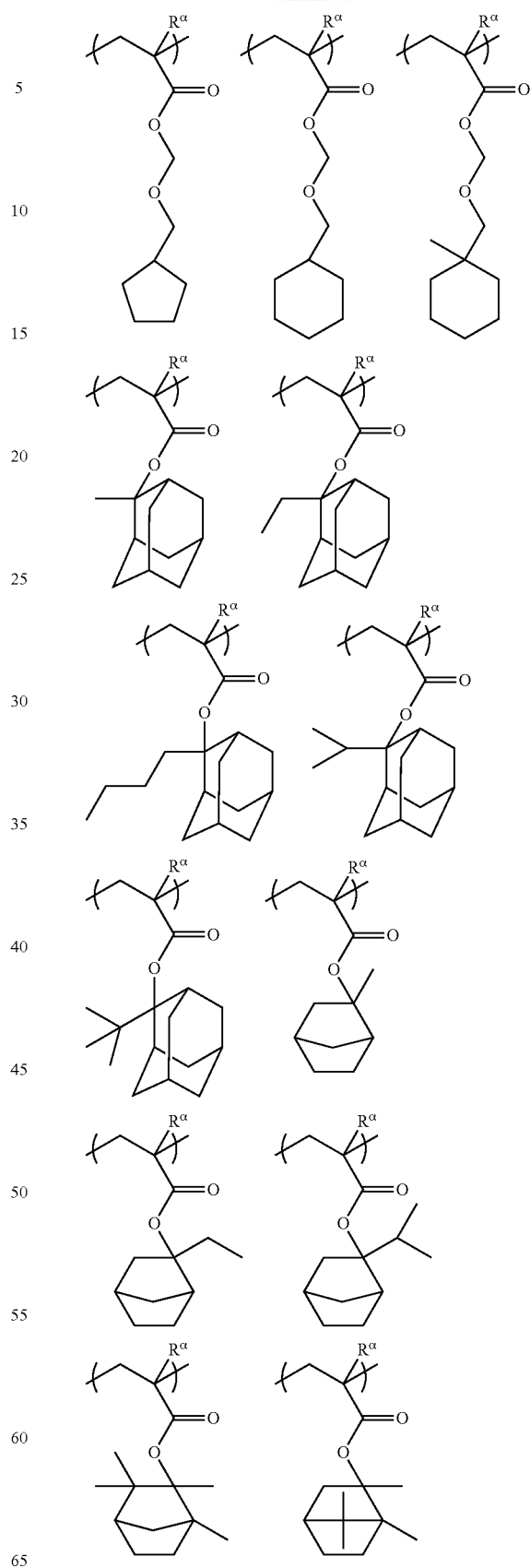

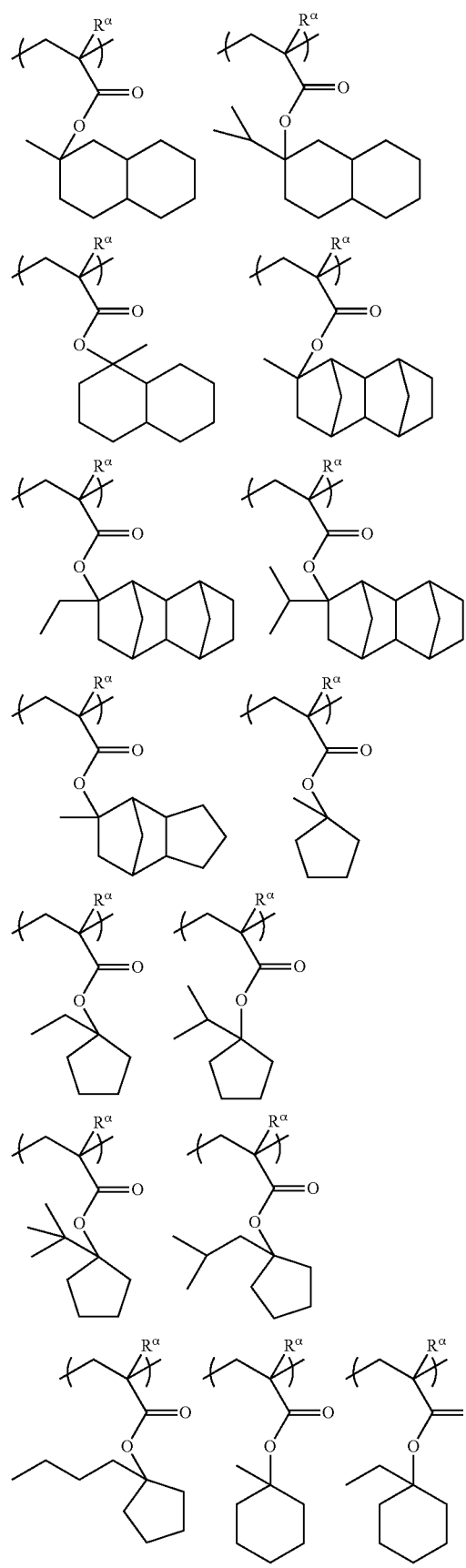
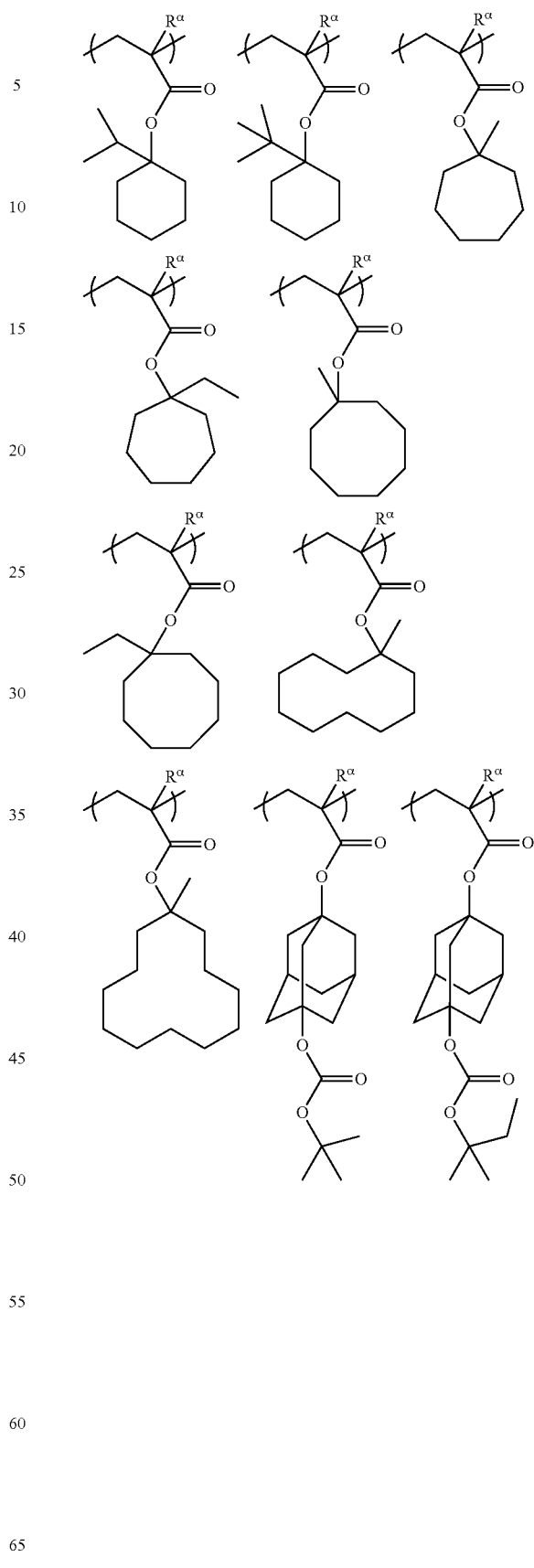

-continued

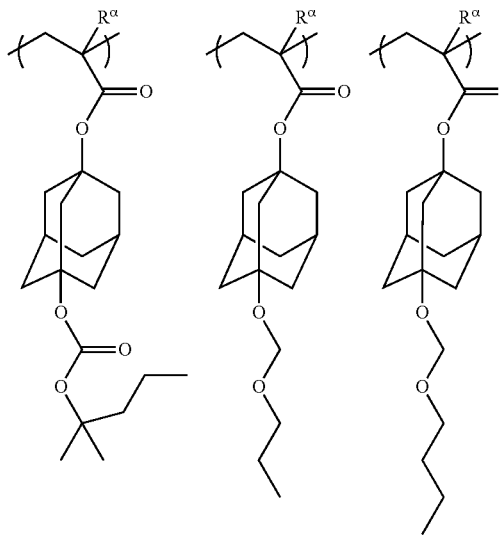

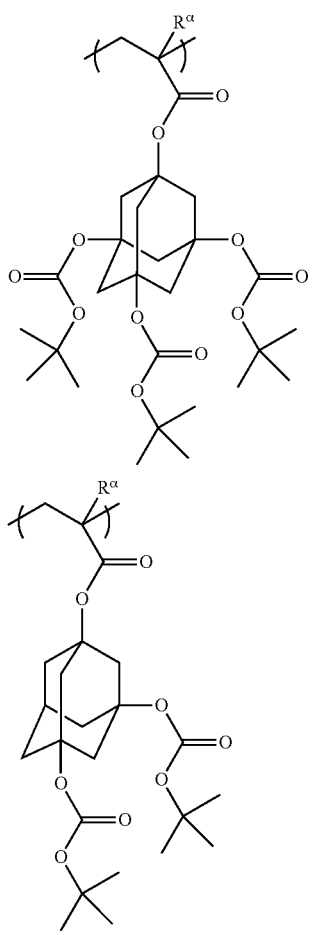

-continued

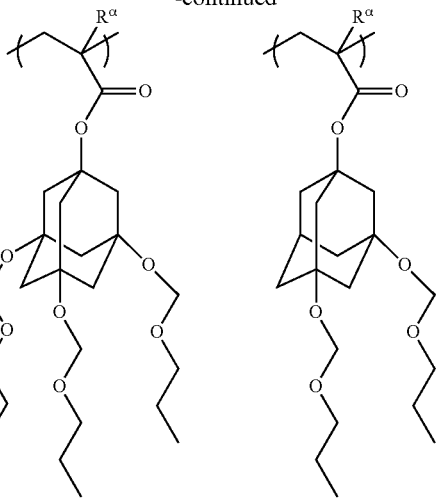

In the present invention, the proportion of the constituent unit (a1) in the component (F) to the total amount of the constituent units constituting the component (F) is preferably in a range of 1% by mole to 50% by mole, more preferably in a range of 10% by mole to 40% by mole, and still more preferably in a range of 15% by mole to 30% by mole.

In the present invention, it is preferable that the fluorine-containing polymeric compound (F) is a copolymer of a constituent unit represented by formula (f1-1) and a constituent unit (a1).

The mass average molecular weight of the component (F) (Mw) (gel permeation chromatography in terms of polystyrene) is preferably in a range of 1000 to 100000, more preferably in a range of 5000 to 80000, and most preferably in a range of 10000 to 60000. When the mass average molecular weight thereof is less than or equal to the upper limit thereof, the component (F) has solubility in a resist solvent sufficient enough for the component to be used as a resist. When the mass average molecular weight thereof is greater than or equal to the lower limit thereof, the dry etching resistance or the sectional shape of a resist pattern is excellent.

The degree of dispersion (Mw/Mn) of the component (F) is preferably in a range of 1.0 to 5.0, more preferably in a range of 1.0 to 4.0, and most preferably in a range of 1.2 to 3.0.

The component (F) may be used alone or in combination of two or more kinds thereof.

The content of the component (F) in the composition of nanoimprint is preferably in a range of 0.1 parts by mass to 10 parts by mass, more preferably in a range of 0.1 parts by mass to 5 parts by mass, and still more preferably in a range of 0.1 parts by mass to 1 part by mass with respect to 1 part by mass of the component (A) contained in the composition for nanoimprint. When the content thereof is in the above-described range, the photocurability becomes excellent.

If desired, additives with miscibility such as an alkoxysilane compound, a solvent, an additional resin, a dissolution inhibitor, a plasticizer, a stabilizer, a colorant, a halation preventing agent, and a dye, which are used to improve the performance of the composition film for nanoimprint, can be further added to and contained in the composition for nanoimprint of the present embodiment.

Optional Components
Alkoxysilane Compound (B)

It is preferable that the composition for nanoimprint of the present embodiment may further contain an alkoxysilane compound (B). The alkoxysilane compound (B) (hereinafter, also referred to as a component (B)) is a silane compound that includes an alkoxy group (RO—) in which an alkyl group R is bonded to an oxygen atom, and examples thereof include all compounds represented by the following general formulae (B1) to (B3).

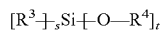 (B1)

[In formula (B1), $R^3$ and $R^4$ each independently represent an alkyl group, s+t is 4, and t represents an integer of 1 to 4.]

In formula (B1), s+t is 4 and t represents an integer of 1 to 4. Further, in formula (B1), $R^3$ and $R^4$ each independently represent an alkyl group. In formula (B1), it is preferable that the alkyl group as $R^3$ and $R^4$ is an alkyl group having 1 to 10 carbon atoms, and examples thereof are the same as those of the alkyl group as $R^2$ in formula (A1). Preferred examples of the alkyl group as $R^3$ and $R^4$ include a methyl group, an ethyl group, or a propyl group. In formula (B1), it is preferable that t represents an integer of 2 to 4. s represents an integer of 0 to 3.

Particularly preferred examples of the alkoxysilane compound represented by formula (B1) include ethyl-tri-n-propoxysilane, tetra-n-propoxysilane, and tetraethoxysilane from the viewpoints of excellent curability and stability of properties of a coating film.

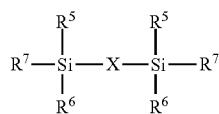 (B2)

[In formula (B2), $R^5$ to $R^7$ each independently represent an alkyl group or an alkoxy group, at least one of $R^5$ to $R^7$ represents an alkoxy group, and X represents a single bond or an alkylene group having 1 to 5 carbon atoms.]

In formula (B2), it is preferable that the alkyl group as $R^5$ to $R^7$ is an alkyl group having 1 to 10 carbon atoms, and examples thereof are the same as those of the alkyl group as $R^2$ in formula (A1). Preferred examples thereof include a methyl group, an ethyl group, or a propyl group. In formula (B2), examples of the alkoxy group as $R^5$ to $R^7$ include those represented by formula —O—$RB^2$ [$RB^2$ represents an alkyl group having 1 to 5 carbon atoms]. Examples of the alkyl group as $RB^2$ are the same as those of the alkyl group as $R^2$ in formula (A1). Preferred examples thereof as $RB^2$ include a methoxy group, an ethoxy group, an n-propoxy group, an iso-propoxy group, an n-butoxy group, and a tert-butoxy group. In formula (B2), the number of alkoxy groups as $R^5$ to $R^7$ is preferably 2 or greater and more preferably in a range of 2 to 6. In formula (B2), examples of the alkylene group having 1 to 5 carbon atoms as X include a methylene group, an ethylene group, an n-propylene group, a tetramethylene group, and a pentamethylene group. In formula (B2), it is preferable that X represents a single bond or an ethylene group.

From the viewpoints of excellent curability and stability of properties of a coating film, particularly preferred examples of the alkoxysilane compound represented by formula (B2) include those represented by the following formula.

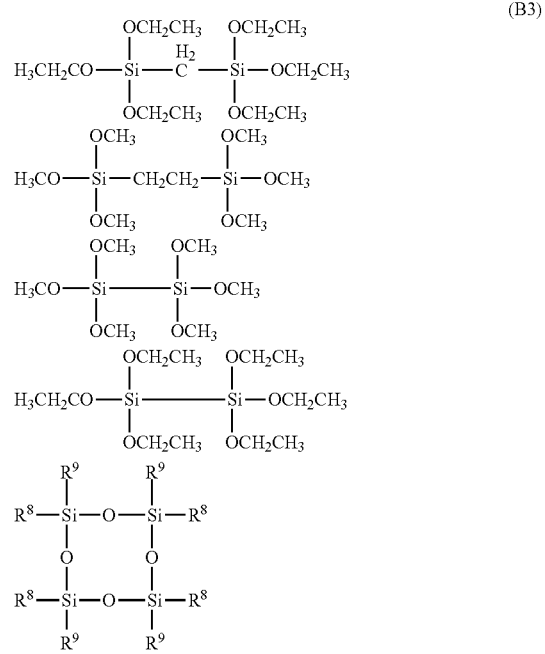

[In formula (B3), $R^8$ and $R^9$ each independently represent an alkyl group or an alkoxy group, and at least one of $R^8$ and $R^9$ represents an alkoxy group.]

In formula (B3), $R^8$ and $R^9$ each independently represent an alkyl group or an alkoxy group, and at least one of $R^8$ and $R^9$ represents an alkoxy group.

In formula (B3), it is preferable that the alkyl group as $R^8$ and $R^9$ is an alkyl group having 1 to 10 carbon atoms, and examples thereof are the same as those of the alkyl group as $R^2$ in formula (A1). As $R^8$ and $R^9$, an alkyl group having 1 to 6 carbon atoms is more preferable and a methyl group is particularly preferable. In formula (B3), examples of the alkoxy group as $R^8$ and $R^9$ include those represented by formula —O—$RB^3$ [$RB^3$ has the same definition as that for $RB^2$ described above]. As $R^8$ and $R^9$, an n-butoxy group is preferable. In formula (B3), the number of alkoxy groups as $R^8$ and $R^9$ is preferably in a range of 2 to 8 and particularly preferably 4. From the viewpoints of excellent curability and stability of properties of a coating film, particularly preferred examples of the alkoxysilane compound represented by formula (B3) include those represented by the following formula.

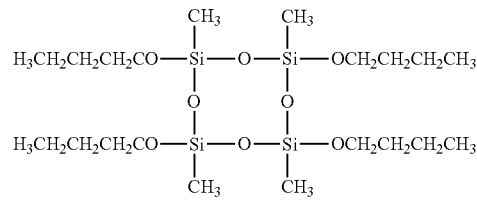

By adding the alkoxysilane compound (B) represented by any of formula (B1) to (B3) described above to the composition for nanoimprint, the curability at the time of irradiation with light can be improved.

The alkoxysilane compound (B) may be used alone or in combination of two or more kinds thereof.

The content of the alkoxysilane compound (B) in the composition for nanoimprint is preferably 10 parts by mass to 120 parts by mass, more preferably in a range of 20 parts by mass to 100 parts by mass, and still more preferably in a range of 25 parts by mass to 80 parts by mass with respect to 1 part by mass of the component (A) included in the composition for nanoimprint. When the content thereof is in the above-described range, the photocurability becomes excellent.

Solvent (D)

The composition for nanoimprint of the present embodiment may or may not contain a solvent (D).

In the case where the composition contains the solvent (D), from the viewpoint of particularly excellent coatability, alcohols are preferable as the solvent (D). Specific examples thereof include alcohols having a chain structure such as methanol (boiling point of 64.7° C.), ethanol (boiling point of 78.3° C.), n-propyl alcohol (boiling point of 97.2° C.), isopropyl alcohol (IPA; boiling point of 82.4° C.), n-pentyl alcohol (boiling point of 138.0° C.), s-pentyl alcohol (boiling point of 119.3° C.), t-pentyl alcohol (boiling point of 101.8° C.), isopentyl alcohol (boiling point of 130.8° C.), isobutanol (also referred to as isobutyl alcohol or 2-methyl-1-propanol) (boiling point of 107.9° C.), 2-ethyl butanol (boiling point of 147° C.), neopentyl alcohol (boiling point of 114° C.), n-butanol (boiling point of 117.7° C.), s-butanol (boiling point of 99.5° C.), t-butanol (boiling point of 82.5° C.), 1-propanol (boiling point of 97.2° C.), n-hexanol (boiling point of 157.1° C.), 2-heptanol (boiling point of 160.4° C.), 3-heptanol (boiling point of 156.2° C.), 2-methyl-1-butanol (boiling point of 128.0° C.), 2-methyl-2-butanol (boiling point of 112.0° C.), 4-methyl-2-pentanol (boiling point of 131.8° C.), 1-butoxy-2-propanol (1,2-propylene glycol 1-monobutyl ether: PGB; boiling point of 170° C.), propylene glycol monopropyl ether (boiling point of 150° C.), 5-methyl-1-hexanol (boiling point of 167° C.), 6-methyl-2-heptanol (boiling point of 171° C.), 1-octanol (boiling point of 196° C.), 2-octanol (boiling point of 179° C.), 3-octanol (boiling point of 175° C.), 4-octanol (boiling point of 175° C.), 2-ethyl-1-hexanol (boiling point of 185° C.), and 2-(2-butoxyethoxy)ethanol (boiling point of 231° C.); and alcohols having a cyclic structure such as cyclopentane methanol (boiling point of 162° C.), 1-cyclopentyl ethanol (boiling point of 167° C.), cyclohexanol (boiling point of 161° C.), cyclohexane methanol (CM; boiling point of 183° C.), cyclohexane ethanol (boiling point of 205° C.), 1,2,3,6-tetrahydrobenzyl alcohol (boiling point of 191° C.), exo-norborneol (boiling point of 176° C.), 2-methyl cyclohexanol (boiling point of 165° C.), cycloheptanol (boiling point of 185° C.), 3,5-dimethyl cyclohexanol (boiling point of 185° C.), benzyl alcohol (boiling point of 204° C.), and terpineol (boiling point of 217° C.). Among these, PGB has a high boiling point of 170° C. and thus the film thickness of the composition for nanoimprint can be easily controlled. The above-described solvents may be used alone or in combination of two or more kinds thereof. Among the solvents described above, alcohols having a chain structure are preferable, and isopropyl alcohol, ethanol, methanol, and 1-butoxy-2-propanol are particularly preferable.

(First Pattern Forming Method)

A second aspect of the present embodiment is a nanoimprint pattern forming method (hereinafter, also referred to as a "first pattern forming method" in some cases) that includes a process of coating a substrate with the composition for nanoimprint of the above-described present embodiment to form a resin layer of the composition for nanoimprint; a process of pressing a mold, on which an uneven structure having a predetermined pattern is formed, to the resin layer of the composition for nanoimprint and deforming the resin layer of the composition for nanoimprint to the predetermined pattern; and a process of exposing the resin layer of the composition for nanoimprint to light in the state in which the mold is pressed.

FIGS. 1A to 1F are views illustrating the processes of the first pattern forming method using nanoimprint lithography according to the embodiment.

First, as illustrated in FIG. 1A, a substrate 1 is coated with the composition for nanoimprint to form a resin layer 2 of the composition for nanoimprint. As the substrate 1, a Si wafer, copper wiring, and an insulating layer, on which semiconductor microfabrication is performed, and a hard disk substrate on which a magnetic layer for discrete track media (DTM) is formed before a pattern is formed are exemplified.

Examples of the method of coating the substrate with the composition for nanoimprint include a spin coating method, a spray method, a roll coating method, and a rotary coating method. Since the resin layer 2 functions as a mask in a process of etching the substrate 1 which is subsequently performed, it is preferable that the thickness of the resin layer 2 when applied to the substrate 1 is uniform. Accordingly, the spin coating method is suitable for coating the substrate 1 with the composition for nanoimprint.

Figure 1B:
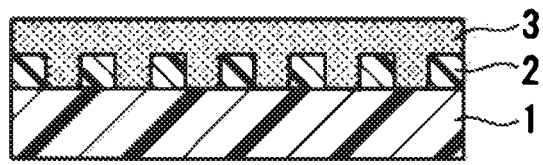
FIG. 1B is a schematic illustration of an example of a nanoimprint pattern forming method according to the present embodiment.

Next, as illustrated in FIG. 1B, in the substrate 1 on which the resin layer 2 is laminated, a mold 3 on which the predetermined pattern having an uneven structure is formed is pressed against the resin layer 2, and the resin layer 2 is deformed according to the pattern with the uneven structure of the mold 3. The pressure at the time when the mold 3 is pressed against the resin layer 2 is preferably 10 MPa or less, more preferably 5 MPa or less, and particularly preferably 1 MPa or less.

When the mold 3 is pressed against the resin layer 2, the composition for nanoimprint positioned on projections of the mold 3 are easily pressed into recesses of the mold 3, and the uneven structure of the mold 3 is transferred to the resin layer 2.

Figure 1C:
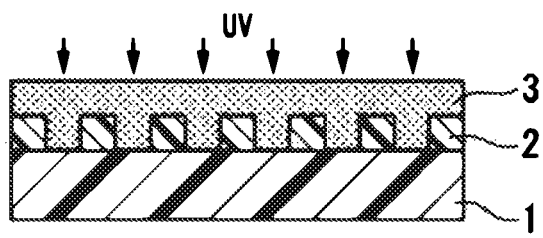
FIG. 1C is a schematic illustration of an example of a nanoimprint pattern forming method according to the present embodiment.

Next, as illustrated in FIG. 1C, the resin layer 2 is exposed to light in the state in which the mold 3 is pressed. Specifically, the resin layer 2 is irradiated with electromagnetic waves such as ultraviolet (UV) rays (indicated by arrows). Due to the exposure, the composition for nanoimprint is cured in the state in which the mold 3 is pressed, and a resist film formed of the resin layer 2 to which the uneven structure of the mold 3 is transferred is formed. Moreover, the mold 3 has permeability to the electromagnetic waves applied to the resin layer.

Figure 1D:
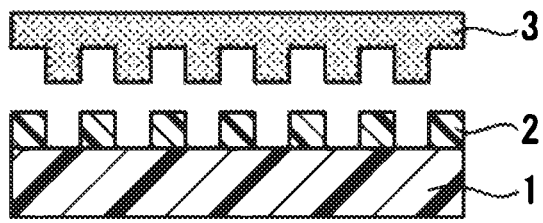
FIG. 1D is a schematic illustration of an example of a nanoimprint pattern forming method according to the present embodiment.

Subsequently, as illustrated in FIG. 1D, the mold 3 is peeled off from the substrate 1 and the resin layer 2. In this manner, the resin layer 2 in a cured state is patterned on the substrate 1.

In the present embodiment, it is considered that the adhesion of the composition for nanoimprint to the substrate 1 is improved and the releasing properties of the composition for nanoimprint from the mold 3 are improved by employing the composition for nanoimprint containing the fluorine-containing polymeric compound (F).

Therefore, in the process of peeling the mold 3 from the substrate 1 and the resin layer 2, the mold 3 can be peeled off from the substrate 1 and the resin layer 2 without the resin layer 2 being adhered to the mold 3.

In the present embodiment, a release layer may be formed by further coating a surface 31 of the mold 3 with a release agent. Here, examples of the release agent applied to the surface of the mold include a silicon-based release agent, a fluorine-based release agent, a polyethylene-based release agent, a polypropylene-based release agent, a paraffin-based release agent, a montan-based release agent, and a carnauba-based release agent. For example, a commercially available coating type release agent such as OPTOOL DSX (manufactured by DAIKIN INDUSTRIES, Ltd.) can be suitably used. Further, the release agent may be used alone or in combination of two or more kinds thereof. Among the above-described examples, a fluorine-based release agent is particularly preferable.

Figure 1E:
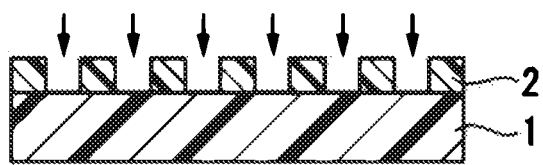
FIG. 1E is a schematic illustration of an example of a nanoimprint pattern forming method according to the present embodiment.

Next, as illustrated in FIG. 1E, it is preferable that the substrate 1 exposed to the opening portions (portions formed by projections of the mold 3 being brought into contact with the resin layer 2) of the resin layer 2 is etched to a predetermined depth for removal by irradiating the substrate 1 on which the patterned resin layer 2 is formed with plasma and/or reactive ions (indicated by arrows).

Gas of plasma and/or reactive ions to be used in the etching process is not particularly limited as long as the gas is typically used in the dry etching field.

Using the selection ratio of the composition for nanoimprint which is employed together with the substrate, suitable gas can be appropriately selected.

Figure 1F:
FIG. 1F is a schematic illustration of an example of a nanoimprint pattern forming method according to the present embodiment.

Next, as illustrated in FIG. 1F, after the substrate 1 is etched, the resin layer 2 present on the substrate 1 is removed. The method of removing the resin layer 2, which is unnecessary, from the substrate 1 is not particularly limited, and a treatment of cleaning the substrate 1 using a solution that can dissolve the resin layer 2 is exemplified.

(Second Pattern Forming Method)

A third aspect of the present embodiment is a nanoimprint pattern forming method (hereinafter, also referred to as a "second pattern forming method" in some cases) that includes a process of forming an organic layer on an inorganic substrate; a process of coating the organic layer with the composition for nanoimprint to form a resin layer of the composition for nanoimprint; a process of pressing a mold, on which an uneven structure having a predetermined pattern is formed, to the composition layer for nanoimprint and deforming the composition layer for nanoimprint to the predetermined pattern; and a process of exposing the composition layer for nanoimprint to light in the state in which the mold is pressed.

FIGS. 2A to 2H are views illustrating the processes of the second pattern forming method using nanoimprint lithography according to the embodiment.

Figure 2A:
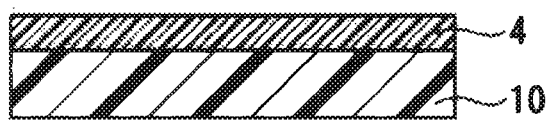
FIG. 2A is a schematic illustration of an example of a nanoimprint pattern forming method according to the present embodiment.

First, as illustrated in FIG. 2A, an organic layer 4 is formed on the substrate 10. The film thickness of the organic layer 4 may be appropriately adjusted according to the depth of the substrate 10 to be processed (etched), and is preferably in a range of 0.02 µm to 2.0 µm. The substrate 10 is a substrate formed of an inorganic material, such as a sapphire substrate, a GaN substrate, or a Si substrate. As the material of the organic layer 4, a material which has lower etching resistance to oxygen-based gas compared to the composition for nanoimprint to be formed in the subsequent process and has higher etching resistance to halogen-based gas compared to the substrate 10 is preferable. The method of forming the organic layer 4 is not particularly limited, and a sputtering method or a spin coating method is exemplified.

Examples of the material suitable for the sputtering method include diamond-like carbon. In addition, examples of the material suitable for the spin coating method include a novolak resin, an acrylic resin, and a phenolic resin. The organic layer 4 can be formed by obtaining a solution by means of dissolving these resins in a solvent, spin-coating the substrate 10 with the solution using a spinner or the like, and then heating the substrate 10 at a temperature of 200° C. and preferably in a temperature range of 200° C. to 300° C.

Examples of the solvent for spin coating include ketones such as acetone, methyl ethyl ketone, cyclopentanone, cyclohexanone, methyl amyl ketone, methyl isoamyl ketone, and 1,1,1-trimethyl acetone; polyhydric alcohols and derivatives thereof such as ethylene glycol, ethylene glycol monoacetate, diethylene glycol, diethylene glycol monoacetate, propylene glycol, propylene glycol monoacetate, monomethyl ether, monoethyl ether, monopropyl ether, monobutyl ether, and monophenyl ether of these; cyclic ethers such as dioxane; and esters such as ethyl lactate, methyl acetate, ethyl acetate, butyl acetate, methyl pyruvate, ethyl pyruvate, methyl 3-methoxypropionate, and ethyl 3-ethoxypropionate. These may be used alone or in combination of two or more kinds thereof.

Figure 2B:
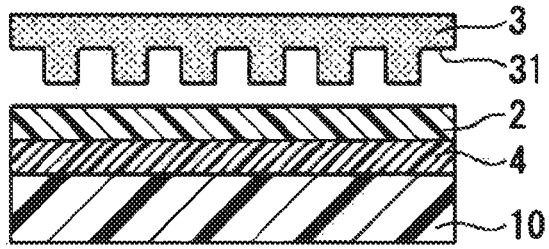
FIG. 2B is a schematic illustration of an example of a nanoimprint pattern forming method according to the present embodiment.

Next, as illustrated in FIG. 2B, the organic layer 4 is coated with the composition for nanoimprint to form the resin layer 2 of the composition for nanoimprint which has a thickness of preferably in a range of 0.02 µm to 1.0 µm. Examples of the method of coating the organic layer with the composition for nanoimprint include a spin coating method, a spray method, a roll coating method, and a rotary coating method.

In the present invention, a release layer may be formed by coating the surface 31 of the mold 3 with a release agent as illustrated in FIG. 2B. Here, examples of the release agent applied to the surface of the mold include a silicon-based release agent, a fluorine-based release agent, a polyethylene-based release agent, a polypropylene-based release agent, a paraffin-based release agent, a montan-based release agent, and a carnauba-based release agent. For example, a commercially available coating type release agent such as OPTOOL DSX (manufactured by DAIKIN INDUSTRIES, Ltd.) can be suitably used. Further, the release agent may be used alone or in combination of two or more kinds thereof. Among the above-described examples, a fluorine-based release agent is particularly preferable.

Figure 2C:
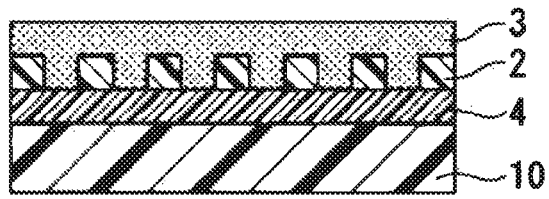
FIG. 2C is a schematic illustration of an example of a nanoimprint pattern forming method according to the present embodiment.

Next, as illustrated in FIG. 2C, in the substrate 10 on which the organic layer 4 and the resin layer 2 are laminated, the mold 3 on which the predetermined pattern having an uneven structure is formed is pressed against the resin layer 2, and the resin layer 2 is deformed according to the pattern with the uneven structure of the mold 3.

The pressure at the time when the mold 3 is pressed against the resin layer 2 is preferably 10 MPa or less, more preferably 5 MPa or less, and particularly preferably 1 MPa or less.

When the mold 3 is pressed against the resin layer 2, the composition for nanoimprint positioned on projections of the mold 3 are easily pressed into recesses of the mold 3, and the uneven structure of the mold 3 is transferred to the resin layer 2.

Figure 2D:
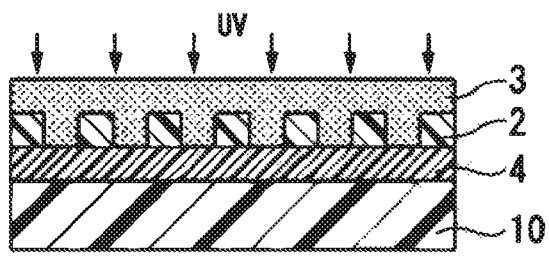
FIG. 2D is a schematic illustration of an example of a nanoimprint pattern forming method according to the present embodiment.

Next, as illustrated in FIG. 2D, the resin layer 2 is exposed to light in the state in which the mold 3 is pressed. Specifically, the resin layer 2 is irradiated with electromagnetic waves such as ultraviolet (UV) rays (indicated by arrows). Due to the exposure, the resin layer 2 is cured in the state in which the mold 3 is pressed, and a resist film formed of the resin layer 2 to which the uneven structure of the mold 3 is transferred is formed on the organic layer 4. Moreover, the mold 3 has permeability to the electromagnetic waves applied to the resin layer.

Figure 2E:
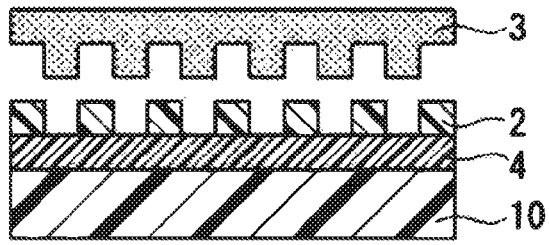
FIG. 2E is a schematic illustration of an example of a nanoimprint pattern forming method according to the present embodiment.

Subsequently, as illustrated in FIG. 2E, the mold 3 is peeled off from the substrate 10 and the resin layer 2. In this manner, the resin layer 2 in a cured state is patterned on the organic layer 4.

Figure 2F:
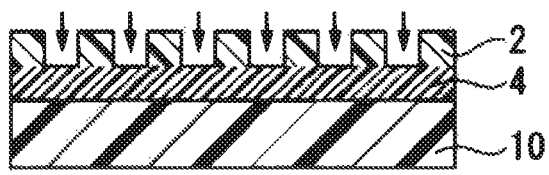
FIG. 2F is a schematic illustration of an example of a nanoimprint pattern forming method according to the present embodiment.

Next, as illustrated in FIG. 2F, the organic layer 4 exposed to opening portions (portions formed by projections of the mold 3 being brought into contact with the resin layer 2) of the resin layer 2 is etched for removal by irradiating the substrate 10 on which the patterned resin layer 2 is formed with $O_2$-based plasma and/or reactive ions (indicated by arrows in the figure). In this manner, the organic layer 4 on which the predetermined pattern is formed is patterned on the substrate 10.

Figure 2G:
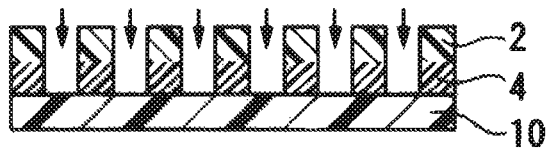
FIG. 2G is a schematic illustration of an example of a nanoimprint pattern forming method according to the present embodiment.

Subsequently, as illustrated in FIG. 2G, the substrate 1 exposed to opening portions (portions corresponding to the projections of the mold 3) of the organic layer 4 is etched to a predetermined depth for removal by irradiating the substrate 10 on which the patterned organic layer 4 is formed with halogen-based plasma and/or reactive ions (indicated by arrows in the figure) after the resin layer 2 is removed.

Figure 2H:
FIG. 2H is a schematic illustration of an example of a nanoimprint pattern forming method according to the present embodiment.

Next, as illustrated in FIG. 2H, after the substrate 10 is etched, the organic layer 4 present on the substrate 10 is removed. The method of removing the organic layer 4, which is unnecessary, from the substrate 10 is not particularly limited, and a treatment of cleaning the substrate 10 using a solution that can dissolve the organic layer 4 is exemplified.

According to the second pattern forming method described above, even in a case where a difference in the etching rate with respect to the $O_2$-based plasma and/or reactive ions between the composition for nanoimprint and the substrate is not sufficient, a desired pattern can be easily and reliably formed by transferring the pattern to the organic layer in which the etching rate with respect to the halogen-based plasma and/or reactive ions is sufficiently small compared to that of the substrate and performing etching on the substrate using the organic layer as a mask.

EXAMPLES

Hereinafter, the present invention will be described in detail with reference to examples, but the present invention is not limited to the following examples.

Example 1: Composition 1 for Nanoimprint 1 part by mass of the following compound (C)-1 and 1 part by mass of the following polymeric compound (F)-1 (30% PGMEA supply) were mixed with 100 parts by mass of a resin component obtained by mixing 3 parts by mass of the following polymeric compound (A)-1 with 97 parts by mass of the following polymeric compound (B1)-1, thereby preparing a composition 1 for nanoimprint.

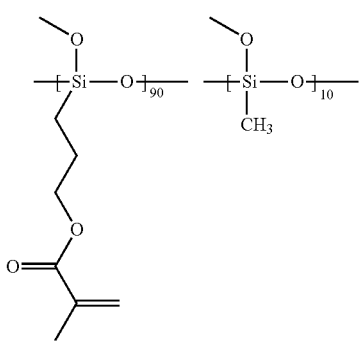

(A)-1

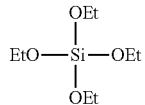

(B1)-1

(Et represents an ethyl group.)

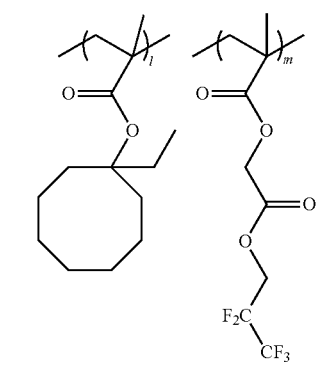

(molar ratio: 1/m - 20/80), Mw is 23100, Mw/Mn is 1.78.

Comparative Example 1: Composition 2 for Nanoimprint

A composition 2 for nanoimprint was prepared in the same manner as that of the above-described composition 1 for nanoimprint except that 1 part by mass of an additive 1 (trade name: BYK-UV3500, manufactured by BYK Japan KK) was used as an additive component in place of the polymeric compound (F)-1.

Comparative Example 2: Composition 3 for Nanoimprint

A composition 3 for nanoimprint was prepared in the same manner as that of the above-described composition 1 for nanoimprint except that 1 part by mass of an additive 2 (trade name: BYK-3560, manufactured by BYK Japan KK) was used as an additive component in place of the polymeric compound (F)-1.

Evaluation of Solubility

With respect to the above-described compositions 1 to 3 for nanoimprint, the solubility of the additive components (the above-described polymeric compound (F)-1 and the additives 1 and 2) in the resin components was evaluated. A case where the resin components and the additive components were dissolved was evaluated as "A" and a case where the resin components and the additive components were not dissolved was evaluated as "C." The results are listed in Table 1.

Evaluation of Performance for Improving Contact Angle

The contact angles of the compositions 1 and 2 for nanoimprint were measured before and after the additive components were blended and the performance for improving the contact angle before and after the additive components were blended was evaluated by following the procedures described below.

Procedure (1): A silicon substrate was respectively coated with the compositions 1 and 2 for nanoimprint, before and after the additive components were blended, using a spinner, thereby forming a composition film for nanoimprint having a film thickness of approximately 50 nm.

Procedure (2): 2 µL of water was added dropwise to the surface of the composition film for nanoimprint obtained by performing the procedure (1), and the contact angle (static contact angle) was measured using a contact angle meter.

The results are listed in Table 1.

TABLE 1

|  | | Additive components | Evaluation of solubility | Performance of improving contact angle |
|---|---|---|---|---|
| Example 1 | Composition 1 for nanoimprint | Polymeric compound (F)-1 | A | 100° (before addition: 66°) |
| Comparative Example 1 | Composition 2 for nanoimprint | Additive 1 | A | 80° (before addition: 66°) |
| Comparative Example 2 | Composition 3 for nanoimprint | Additive 2 | C | — |

As listed in Table 1, the compositions employing the polymeric compound (F)-1 or the additive 1 as the additive components exhibited excellent resin solubility.

Further, the composition 1 for nanoimprint employing the polymeric compound (F)-1 as the additive component was better in performance for improving the contact angle than that of the composition 2 for nanoimprint.

Examples 1-1 to 1-4 and Comparative Example 3

In the above-described composition 1 for nanoimprint, compositions 1-1 to 1-4 for nanoimprint in which the blending amounts listed in the following Table 2 were set as the blending amounts of the polymer compound (F)-1 were prepared.

A composition 4 for nanoimprint was prepared in the same manner as that of the composition 1 for nanoimprint except that the polymeric compound (F)-1 was not blended.

Evaluation of Performance for Improving Contact Angle

The contact angles of the compositions 1-1 to 1-4 and 4 for nanoimprint were evaluated by following the procedures described below.

Procedure (1): A silicon substrate was respectively coated with the compositions 1-1 to 1-4 and 4 for nanoimprint, thereby forming a composition film for nanoimprint having a film thickness of approximately 50 nm.

Procedure (2): 2 µL of water was added dropwise to the surface of the composition film for nanoimprint obtained by performing the procedure (1), and the contact angle (static contact angle) was measured using a contact angle meter.

The results are listed in Table 2.

Mold Releasing Properties

Pattern Formation Using Composition for Nanoimprint

The silicon substrate was respectively coated with the compositions 1-1 to 1-4 and 4 for nanoimprint using a spinner (2000 rpm), thereby forming a composition film for nanoimprint having a film thickness of approximately 50 nm.

Next, a concave quartz mold was pressed to the above-described composition film for nanoimprint at room temperature (25° C.) and at a press pressure of 0.5 MPa for 30 seconds using a nanoimprinter ST2000 (manufactured by TOSHIBA MACHINE CO., LTD.). Subsequently, the composition film was exposed to light at 10 mW/cm² for 30 seconds using i-LineLED belonging to ST2000 in the state in which the mold was pressed against the composition, and then the mold was peeled off from the composition film.

At this time, a case where the mold was cleanly peeled off from the composition film for nanoimprint was evaluated as "A," a case where the mold was peeled off from the composition film for nanoimprint by slightly applying force thereto using a pair of tweezers was evaluated as "B," and a case where the mold was not peeled off from the composition film for nanoimprint was evaluated as "C." The results thereof are listed in Table 2.

TABLE 2

|  |  | Amount of polymeric compound (F)-1 to be added (parts by mass) | Contact angle (°) | Mold releasing properties |
|---|---|---|---|---|
| Example 1-1 | Composition 1-1 for nanoimprint | 1.0 | 100.4 | A |
| Example 1-2 | Composition 1-2 for nanoimprint | 0.5 | 101.2 | A |
| Example 1-3 | Composition 1-3 for nanoimprint | 0.2 | 98.8 | A |
| Example 1-4 | Composition 1-4 for nanoimprint | 0.1 | 67.9 | B |
| Comparative Example 3 | Composition 4 for nanoimprint | 0 | 66.9 | C |

From the results described above, in the case where the compositions 1-1 to 1-4 for nanoimprint were used, the contact angle of the resin layer was large and the mold releasing properties were excellent.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: substrate
2: resin layer
3: mold
4: organic layer
10: substrate

What is claimed is:

1. A composition for nanoimprinting comprising:
    a siloxane polymer (A) which includes a polymerizable group polymerized by irradiation with light;
    a polymerization initiator (C); and
    a fluorine-containing polymeric compound (F),
    wherein the fluorine-containing polymeric compound (F) comprises a constituent unit represented by the following formula (f1-1)), and the content of the fluorine-containing polymeric compound (F) is in a range of 0.1 parts by mass to 10 parts by mass, with respect to 1 part by mass of the siloxane polymer (A) contained in the composition:

(f1-1)

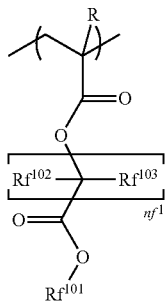

wherein R represents a hydrogen atom, an alkyl group having 1 to 5 carbon atoms, or a halogenated alkyl group having 1 to 5 carbon atoms; $Rf^{102}$ and $Rf^{103}$ each independently represent a hydrogen atom, a halogen atom, an alkyl group having 1 to 5 carbon atoms, or a halogenated alkyl group having 1 to 5 carbon atoms, $Rf^{102}$ and $Rf^{103}$ may be the same as or different from each other; $nf^1$ represents an integer of 1 to 5, and $Rf^{101}$ represents an organic group including a fluorine atom.

2. The composition for nanoimprint according to claim 1, wherein the fluorine-containing polymeric compound (F) further comprises a constituent unit containing an alicyclic hydrocarbon group.

3. The composition for nanoimprint according to claim 1, wherein the siloxane polymer (A) is a polymeric compound represented by the following formula (A1),

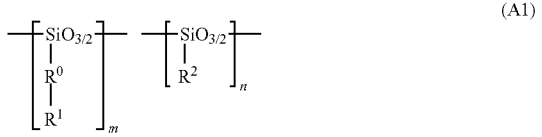

(A1)

wherein $R^1$ represents a group containing an ethylenic unsaturated double bond; $R^0$ represents an alkylene group having 1 to 9 carbon atoms, m $R^0$'s may be different from each other; $R^2$ represents an alkyl group, an aryl group, or a hydrogen atom, n $R^2$'s may be different from each other; and m:n is in a range of 50:50 to 100:0.

4. The composition for nanoimprint according to claim 1, further comprising:
   an alkoxysilane compound (B)
   represented by any of the following formulae (B1) to (B3):

(B1)

wherein $R^3$ and $R^4$ each independently represent an alkyl group; s+t is 4, t represents an integer of 1 to 4, and s represents an integer of 0 to 3;

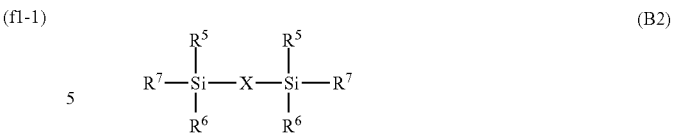
(B2)

wherein $R^5$ to $R^7$ each independently represent an alkyl group or an alkoxy group, at least one of $R^5$ to $R^7$ represents an alkoxy group; and X represents a single bond or an alkylene group having 1 to 5 carbon atoms; and

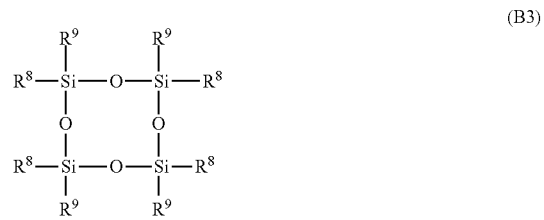
(B3)

wherein $R^8$ and $R^9$ each independently represent an alkyl group or an alkoxy group, and at least one of $R^8$ and $R^9$ represents an alkoxy group.

5. A nanoimprint pattern forming method comprising:
   coating a substrate with the composition for nanoimprint according to claim 1 to form a resin layer of the composition for nanoimprint;
   pressing a mold, on which an uneven structure having a predetermined pattern is formed, to the resin layer of the composition for nanoimprint and deforming the resin layer of the composition for nanoimprint to the predetermined pattern; and
   exposing the resin layer of the composition for nanoimprint to light in a state where the mold is pressed.

6. A nanoimprint pattern forming method comprising:
   forming an organic layer on an inorganic substrate;
   coating the organic layer with the composition for nanoimprint according to claim 1 to form a resin layer of the composition for nanoimprint;
   pressing a mold, on which an uneven structure having a predetermined pattern is formed, to the resin layer of the composition for nanoimprint and deforming the resin layer of the composition for nanoimprint to the predetermined pattern; and
   exposing the resin layer of the composition for nanoimprint to light in a state where the mold is pressed.

7. The nanoimprint pattern forming method according to claim 5, further comprising etching the resin layer of the composition for nanoimprint, which is deformed to the predetermined pattern, as a mask.

\* \* \* \* \*